United States Patent [19]

Katzmann

[11] Patent Number: 5,783,805
[45] Date of Patent: Jul. 21, 1998

[54] ELECTROTHERMAL CONVERSION ELEMENTS, APPARATUS AND METHODS FOR USE IN COMPARING, CALIBRATING AND MEASURING ELECTRICAL SIGNALS

[76] Inventor: Fred L. Katzmann, 48 Bennett Ave., Cedar Grove, N.J. 07099-2004

[21] Appl. No.: 366,674

[22] Filed: Dec. 30, 1994

Related U.S. Application Data

[63] Continuation-in-part of Ser. No. 894,103, Jun. 5, 1992, Pat. No. 5,378,873.

[51] Int. Cl.$^6$ .............................. H05B 1/02; G01R 5/26
[52] U.S. Cl. .................. 219/494; 219/483; 219/486; 219/502; 219/543; 324/106; 324/132; 136/225; 136/230; 136/239
[58] Field of Search ................................ 219/483, 486, 219/502, 501, 497, 543; 324/104, 106, 132, 142; 136/200, 225, 230, 239, 211, 212

[56] References Cited

U.S. PATENT DOCUMENTS

| | | |
|---|---|---|
| 1,121,835 | 12/1914 | Hiatt . |
| 1,662,889 | 3/1928 | Hubbard . |
| 1,765,563 | 6/1930 | Borden et al. . |
| 1,862,014 | 6/1932 | Grondahl . |
| 2,031,480 | 2/1936 | Hamada . |
| 2,178,548 | 11/1939 | Black et al. . |
| 2,413,021 | 12/1946 | Wolfson et al. . |
| 2,463,805 | 3/1949 | Polye et al. . |
| 2,496,541 | 2/1950 | Johnson, Jr. . |
| 2,545,390 | 3/1951 | Spahn . |
| 2,577,111 | 12/1951 | Downing, Jr. et al. . |
| 3,052,846 | 9/1962 | Hill . |
| 3,267,376 | 8/1966 | Harries . |
| 3,435,319 | 3/1969 | Richman . |
| 3,488,573 | 1/1970 | Cavigelli . |
| 3,521,164 | 7/1970 | Richman . |
| 3,597,685 | 8/1971 | Ford . |
| 3,609,541 | 9/1971 | Scott, Jr. . |
| 3,689,824 | 9/1972 | Malcolm . |
| 3,705,365 | 12/1972 | Szabo . |
| 3,723,845 | 3/1973 | Duckworth . |
| 4,091,284 | 5/1978 | Yamamoto et al. . |
| 4,370,546 | 1/1983 | Warner . |
| 4,558,342 | 12/1985 | Sclar ................................ 357/30 |
| 4,659,910 | 4/1987 | Harrison, Jr. et al. . |
| 4,695,793 | 9/1987 | Katzmann . |
| 4,901,006 | 2/1990 | Harrison, Jr. et al. . |
| 4,953,387 | 9/1990 | Johnson et al. ................ 73/25.03 |
| 5,012,813 | 5/1991 | Pompei et al. . |
| 5,059,543 | 10/1991 | Wise et al. ...................... 437/3 |
| 5,170,041 | 12/1992 | Amith et al. . |

OTHER PUBLICATIONS

Terman, Radio–Engineers' Handbook, First Edition, McGraw–Hill Book Co., New York and London, pp. 926–929 (1943).

Hemach, "Thermal Converters as AC–DC Transfer Standards for Current and Voltage Measurement at Audio Frequencies," Journal of Research at the National Bureau of Standards, vol. 48, No. 2, Research Paper–2296, pp. 121–138 (Feb., 1952).

(List continued on next page.)

Primary Examiner—Mark H. Paschall
Attorney, Agent, or Firm—Fish & Richardson P.C.

[57] ABSTRACT

Electrothermal conversion elements, apparatus and methods for use in comparing, calibrating and measuring electrical signals utilizing a thin film heater on a thin, low mass, low thermal conductivity substrate and low mass thermoresistive or PN junction thermal radiation sensors. The element emits IR radiation in response to electrical input. The radiation is collected and converted to an electrical signal proportional to the RMS value of the input signal. Isothermal operation enhances both IR and electrical operation.

33 Claims, 6 Drawing Sheets

OTHER PUBLICATIONS

Sears, et al., University Physics, 2nd Edition, Addison–Wesley Publishing Co., Cambridge, Mass. pp. 546–553 (1955).

Richmann, "A New Wideband True RMS–to–DC Converter," IEEE Transactions on Instrumentation and Measurement, p. 129 (Jun., 1967).

Klonz et al., "Accurate Thinfilm Multijunction Thermal Converter on a Silicon Chip," IEEE Transactions on Instrumentation and Measurement, vol. 38, No. 2, pp. 335–337 (Apr., 1989).

Katzmann, A New Isothermal Multijunction Differential Thermal Element IEEE Transactions on Instrumentation and Measurement, vol. 38, No. 2, pp. 346–350 (Apr. 1989).

Katzmann, F.L. "A New Optically Sensed Thermal Element for Precise AC–DC Conversion," IEEE Transactions on Instrumentation and Masurement, vol. 42, No. 2, Apr. 1993, pp. 191–194.

ELECTROTHERMAL CONVERSION ELEMENTS, APPARATUS AND METHODS FOR USE IN COMPARING, CALIBRATING AND MEASURING ELECTRICAL SIGNALS

RELATED CASES

This is a continuation-in-part of my application Ser. No. 894,103, filed Jun. 5, 1992, now U.S. Pat. No. 5,378,873.

FIELD OF THE INVENTION

My invention relates to electrothermal conversion method and apparatus for comparing, calibrating and measuring AC signals by electrothermal conversion, in particular, to more rapid methods and apparatus for accomplishing such conversions. My invention further relates to AC comparison, calibration and measurement methods and apparatus utilizing such electrothermal conversion methods and apparatus.

BACKGROUND OF THE INVENTION

Measurement and calibration of AC signals is much more difficult than in the case of DC. One technique is to apply the AC signal to a heater element contacting a temperature sensor such as one junction of a bimetallic junction thermocouple. According to the Seebeck effect, heating such a junction will induce a current in the wires. (In practice, a very high impedance device, such as a voltmeter, typically is interposed in the circuit of the two wires so that current flow is negligible). The joule heating in the heater, caused by the AC input signal, induces a voltage in the thermocouple. This thermocouple voltage is proportional to the temperature difference between the bimetallic junction adjacent to the heater element and a second, cold or reference temperature junction.

In one type of known method for measurement of AC voltages, the unknown AC signal and an easily measurable DC signal are separately and alternately applied to a heater associated with an electrothermal sensor, such as a thermocouple. First, when the AC signal is connected to the heater, the thermocouple voltage is nulled to a stable voltage source by adjustment of a Lindeck potentiometer circuit, which is adjusted to apply an equal voltage to that generated by the thermocouple. Then, without changing the potentiometer setting, an easily measured DC voltage is substituted for the AC signal applied to the heater element, which again induces a voltage in the thermocouple. The DC voltage amplitude to the heater is increased, increasing the heater temperature, until the voltage generated by the thermocouple is again equal to the voltage previously set by the Lindeck potentiometer during the AC measuring cycle. When this null condition is reached, the amplitude of the substituted DC voltage is measured. This DC amplitude is thereby equal to the RMS amplitude value of the AC signal.

Various methods and apparatus for AC signal measurement or calibration using a thermocouple are disclosed, for example, in U.S. Pat. Nos. 3,723,845, (Duckworth) and 4,659,910 (Harrison, Harper and Katzmann). Klonz and Weiman, IEEE Transactions on Instrumentation and Measurement, vol. 38, no. 2, p. 335 (April 1989) describe a thin film, multijunction thermal converter comprising a heater and a number of thermocouples on a silicon chip. My U.S. Pat. No. 4,695,793 discloses resistive sensing thermal devices in which a sensing resistance of relatively high temperature coefficient of resistivity is in thermal contact with a heater conductor of relatively low temperature coefficient of resistivity.

In another method and apparatus, disclosed in U.S. Pat. No. 4,901,006 (Harrison and Katzmann) and in Katzmann, IEEE Transactions on Instrumentation and Measurement, vol. 38, no. 2, p. 346 (April 1989), a thermal sensing means in thermal contact with one or more heaters is used to determine the temperature produced by the heater(s) as a result of two signals. It discloses maintaining the thermal sensing means and heater(s) in a fairly narrow temperature range (isothermal operation) during the measurement process. In embodiments described there, this is accomplished by use of two heaters in thermal contact with each other, but electrically isolated and each connected to a separate signal, and by having the thermal sensor sense the net temperature produced by both heaters, producing a signal proportional to any difference from the net temperature established during the initial reference condition.

SUMMARY OF THE INVENTION

The present invention is an improvement over the prior art described above. It uses non-contact, radiation temperature sensing. Some aspects of my present invention are described in my articles: Katzmann and Stollery, "A New Optically Sensed Thermal Element for Precise AC-DC Conversion," IEEE Transactions on Instrumentation and Measurement, vol. 42, no. 2, p. 191 (April 1993), and in Katzmann and Klonz, "A Thin-Film Dual-Heater AC-DC Converter with Infra-Red Sensor," Proceedings of the Conference on Precision Electromagnetic Measurements (June 1994), which are incorporated herein by reference.

The embodiments of the present invention are characterized by use of a thermoresistive sensor and by relying upon radiation as the primary mode of transmitting heat from the heater to the sensor. Various means of collecting the radiation are contemplated, including use of one or more IR transmitting lenses, light pipes including infra-red transmitting fiber optics, reflectors, and proximity of heater and sensor.

Radiation sensing employs non-contacting sensors and avoids direct contacting, bi-metallic thermocouple(s) which drain thermal energy from the heater. Non-contacting sensing reduces temperature variations along the heater which cause Thompson effect errors and minimizes shunt paths for higher frequency signal components. The radiation sensing thermal element provides improved accuracy over a wider input signal frequency range, faster response time and increased dynamic amplitude range when compared to conventional single junction, multi-junction wire or planar thermal elements which use direct contact temperature sensing.

Conventional thermal elements cover an input current dynamic range of two to one. These elements must operate in the square law range so that the peak heater temperature varies by four to one over the RMS input signal range of two to one. This temperature excursion may typically be 80 degrees to 320 degrees Celsius. In accordance with this invention, an infra-red emissive target on the heater and a non-contacting, radiation sensor are employed.

The task of the radiation sensor is simplified by use of isothermal operation of the dual heater configuration in accordance with the preferred embodiments, since only the narrow spectrum of an essentially constant net heater system temperature (isothermal) is converted into an electrical voltage to control the negative feedback to the feedback heater. In addition, the bias on the feedback heater may be adjusted for a total heater system temperature at the optimum spectral response of the radiation sensor and associated IR transmissive components. This assures the greatest dynamic range and best signal to noise performance.

The dynamic operating range is determined by the feedback heater current magnitude between the following limits: (a) no input is applied to the signal heater (resulting in maximum feedback heater current), and (b) the current in the feedback heater approaches zero (at maximum signal current). Throughout this range, the heater system temperature is radiantly sensed by the radiation sensor. When thermoresistive sensing is employed, the resistance of the radiation sensor circuit changes with increasing heater temperature (increasing when a sensor with a positive temperature coefficient of resistivity is used) and the feedback amplifier acts to reduce the feedback heater current. This negative feedback loop has sufficient gain and frequency response to maintain the dual heater system at a substantially constant temperature with variations in signal heater current. The two heaters may be of nominally equal resistance. The variation in DC feedback current driving the feedback heater element is therefore directly proportional to the RMS value of the variation in input current through the signal heater.

Radiometrically sensed thermal element advantages include: improved measurement sensitivity, wider input signal dynamic amplitude range, speed (faster measurement time) and more constant frequency response extending to higher input signal frequencies since the thermal and electrical shunt paths presented by conventional direct contact temperature sensing bi-metallic thermocouples are eliminated. The isothermal dual heater differential thermal element is uniquely advantageous when using radiometric sensing—especially when isothermally operated—since its rapid response time and constant operating temperature reduce the long term stability requirements and spectral range of the radiation sensor, as well as simplifying the spectral bandwidth requirements of the IR transmissive components.

In the preferred embodiments of my present invention, the heaters and sensors are supported on one or more low mass, low thermal conductivity substrates, such as a composite or layered silicon dioxide-silicon nitride membrane.

Relatively low resistance, for example, 10 to 250 ohm, high temperature coefficient of resistivity thermal sensors are particularly advantageous in the thermoresistive combinations of my present invention because of the reduced Johnson noise as compared with other, higher impedance sensors. PN junction thermal sensors, however, have the advantage of high sensitivity and produce a higher output voltage with small changes in heater temperature, making it easier to produce an inexpensive instrument.

A thermal element enclosure, such as the standard UHF pattern glass enclosure widely used for thermal elements, is preferred to prevent damage to the thermal converter and to minimize environmental influences. An evacuated thermal element would be preferred when the entire device (heaters and sensors) can be enclosed. Available IR transmissive windows compatible with the glass thermoelement enclosure have significant losses in the 8 to 12 micron range and when combined with costly anti-reflective coatings appear to be only slightly more effective than working in ambient air.

The elements, apparatus and method of my invention are suitable for use in voltage, current or wattage calibration equipment, voltage and current standards, meter circuits, watthour meters, micropotentiometers, thermal converters, and comparators of the type disclosed in U.S. Pat. No. 4,901,006, the disclosures of which are incorporated herein by reference.

DETAILED DESCRIPTION

In accordance with preferred embodiments of my invention, one or more heaters are deposited by sputtering or vacuum deposition on a layer of silicon dioxide and silicon nitride on the top surface of a silicon wafer, and one or more resistive thermal sensors are similarly deposited on a layer of silicon dioxide and silicon nitride on the top surface of the same or another silicon wafer. Then, after covering the entire top surface with a thin film of $SiO_2$ for protection, and masking the edges of the bottom surface with $SiO_2$, the silicon is anisotropically etched from the bottom surface to produce a window closed by a membrane of silicon dioxide and silicon nitride, reducing the mass and thermal conductivity. Because either a layer of only silicon dioxide or only silicon nitride are subject to thermal stress fractures, I prefer that the deposited layers which result in the membrane be either a composite of silicon dioxide and silicon nitride, or a combination of silicon dioxide and silicon nitride layers. The particular combination can be experimentally selected for minimum stress fracture in the particular device configuration.

Figure 1A:
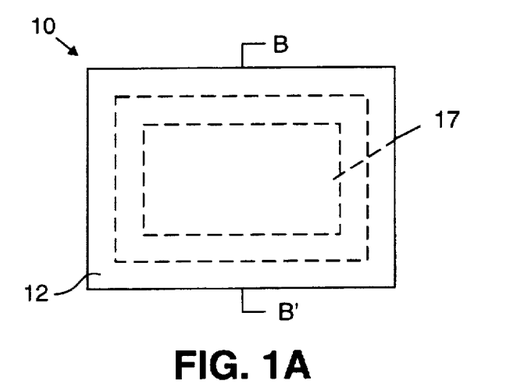
FIG. 1A is a schematic plan view and FIG. 1B is a cross-section along line BB' of a membrane and support used in embodiments of my invention.
Figure 1B:
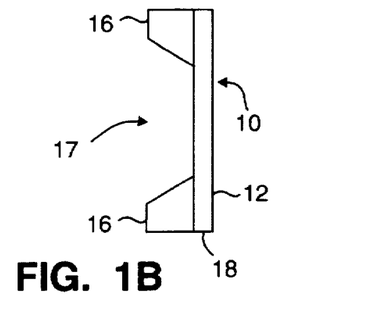

FIG. 1A depicts a schematic plan view and FIG. 1B depicts a schematic cross-section of a substrate 10 for use in accordance with several embodiments of my invention. One or more heaters and one or more thermal sensors (detailed in later Figures) are deposited on the top surface 12 of a silicon wafer, which has been etched to produce a window in the central section 17, leaving a membrane 18 surrounded by a silicon frame 16. Further details of suitable substrate structures and thermal converter preparation techniques are in Klonz and Weimann, Transactions of Instrument & Measurement Society of IEEE (April 1989), the disclosures of which are incorporated herein by reference. A typical substrate is 8 mm×11 mm, with a membrane 18 thickness of 400 um.

Figure 2A:
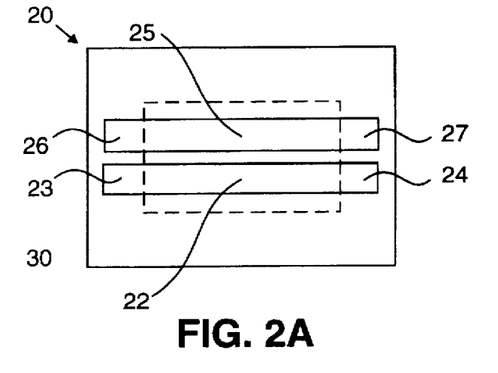
FIG. 2A is a schematic plan view of a thermal element in accordance with an embodiment of my invention.

FIG. 2A shows a simple, two heater thermal element 20 embodiment of my invention for use with a separate thermal sensor, for example, a pyrometer as described in my parent application Ser. No. 894,103, filed Jul. 5, 1992, now U.S. Pat. No. 5,378,873, or one of the sensors described in connection with FIGS. 4 or 5A and 5B. The two heaters 22 and 25, like all of the heaters of the present invention, are preferably of a low temperature coefficient of resistivity material such as Evenohm. The heaters 22 and 25 are deposited on a membrane of the same type as membrane 18 or on another suitable low mass substrate. Pads 23, 24, 26 and 27 are provided over the substrate frame 16 for connection to each heater 22 and 25 respectively by conventional semiconductor techniques, such as fine gold wires bonded to the pads 23, 24, 26 and 27. The heaters can be connected for isothermal operation as disclosed in my parent application or in connection with FIG. 9 below.

Figure 2B:
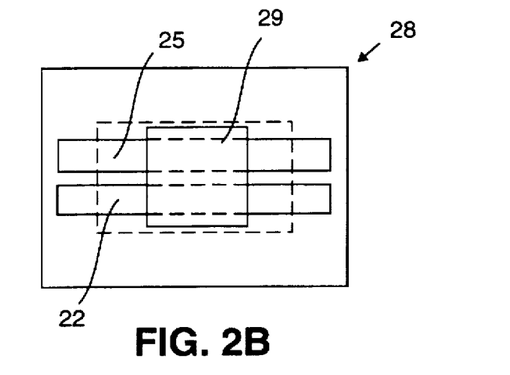
FIG. 2B is a schematic plan view of a thermal element in accordance with an embodiment of my invention with an infra-red radiation-enhancing coating.

FIG. 2B depicts a thermal element 28 similar to that of FIG. 2A in which the heaters 22 and 25 have been covered with a high IR surface emissivity coating 29, such as 3M Black Velvet paint, to improve the IR radiation characteristics.

Figure 3A:
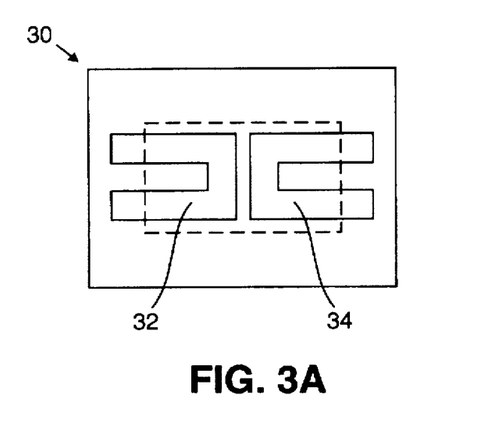
FIG. 3A is a schematic plan view of a thermal element in accordance with an embodiment of my invention with bifilar heaters.
Figure 3B:
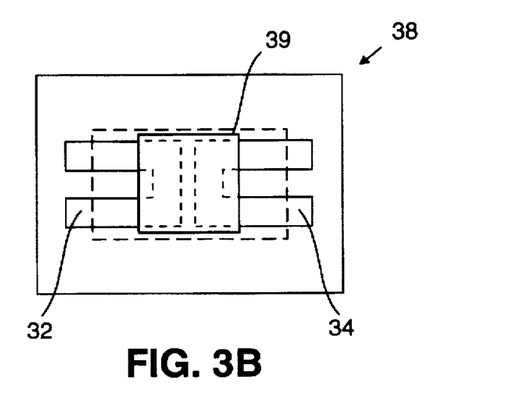
FIG. 3B is a schematic plan view of a thermal element in accordance with an embodiment of my invention with bifilar heaters and a radiation-enhancing coating.

Other patterns of separate thermal elements are also contemplated by my present invention. For example, FIG. 3A depicts a similar thermal element 30 to that of FIG. 2A with bifilar heaters 32 and 34. FIG. 3B depicts a similar thermal element 38 with the addition of a high IR emissivity coating 39.

Figure 4:
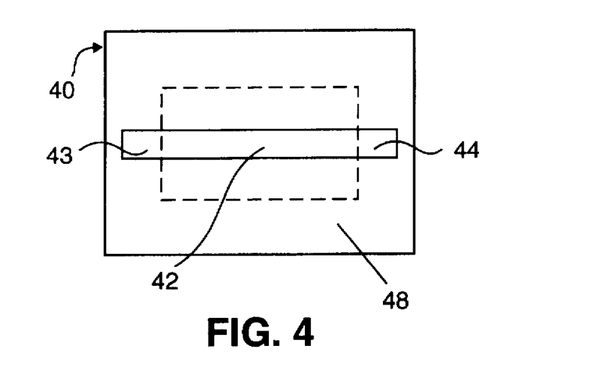
FIG. 4 is a schematic plan view of a radiometric thermoresistive thermal sensor in accordance with one embodiment of my invention.

FIG. 4 depicts a resistive thermal sensor 40 in accordance with an embodiment of my invention. A resistor 42 is deposited on the membrane 48. The thermal sensor 42, like all of the resistive thermal sensors of the present invention, is preferably of a stable, high temperature coefficient of resistivity material such as nickel. Pads 43 and 44 are provided over the substrate frame 16 for connections to the sensor 42 by conventional semiconductor techniques, such as fine gold wires bonded to those pads.

Figure 5A:
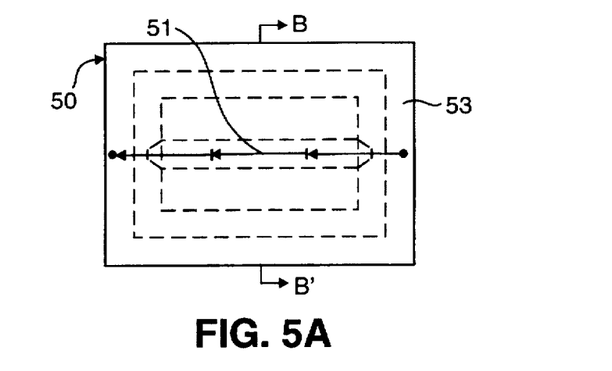
FIGS. 5A and 5B are a schematic plan view and a cross-section along line BB', respectively, of a radiometric semiconductor junction thermal sensor in accordance with an embodiment of my invention.
Figure 5B:
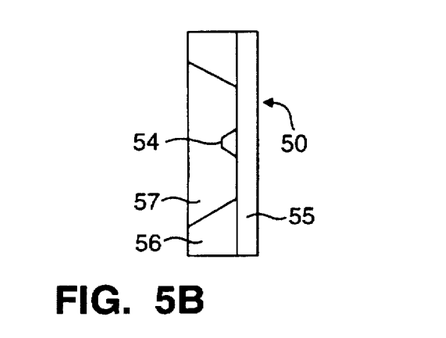

FIG. 5A schematically depicts a semiconductor thermal sensor 50 comprising an array 51 of PN junctions on a surface 53 of a silicon wafer. In order to reduce the mass of the sensor 50, in this embodiment, the central region 57 of the back side of the wafer 52 has been etched in a way similar to that discussed with respect to FIGS. 1A and 1B, leaving a frame 56. A thin silicon membrane 55 or a bridge 54 comprising the PN junctions has been left, as shown in the cross-section BB' in FIG. 5B.

The radiation from the thermal elements can be directed to the sensors in the various embodiments of my present invention in several ways, as shown and described in connection with FIGS. 6A through 6F, 10 and 11 below. In order to reduce interference and overloading of the circuit associated with the sensor by the signal applied to the thermal element heater, I prefer where practical to provide a Faraday electrostatic shield between the thermal element(s) and the sensor(s); The shield should be highly transparent to IR radiation, while capable of providing adequate electrostatic shielding. High transmissivity electroformed nickel mesh of the type made by Buckbee-Mears Co. or a conductive coating on infrared transmissive glass, such as a tin oxide "Nesa" coating or a thin IR transmissive metallic film, can be used. I prefer to provide a quarter-wave length anti-reflection coating on surfaces between the thermal element and sensor when such a costing will reduce losses by reflection which might otherwise occur. Isothermal operation of the heaters in accordance with my present invention improves the effectiveness and simplifies the application of anti-reflection coatings because the radiation wavelength is constant.

Figure 6A:
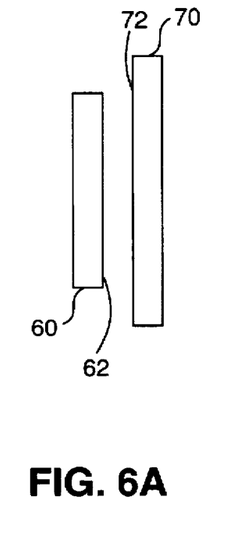
FIG. 6A schematically shows a thermal element and thermal sensor in proximity in accordance with an embodiment of my invention.

FIG. 6A schematically shows a thermal heater element 60, such as thermal elements 20, 28, 30 or 38, placed with the top surface 62 facing and in very close proximity to the top surface 72 of a radiation sensor 70, such as sensor 40 or 50. In order to reduce inductive coupling between the thermal element 60 and the thermal sensor 70, I prefer to orient the conductors of the thermal sensor 70 (such as the resistor 42 of thermal sensor 40) perpendicular to the most proximate conductors (such as heaters 22 and 24 of thermal element 20) where practical.

Figure 6B:
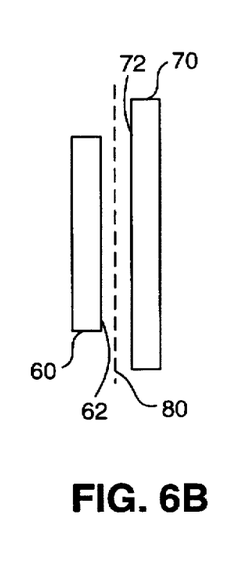
FIG. 6B schematically shows a thermal element and thermal sensor in proximity with an infra-red transmitting mesh Faraday shield in accordance with an embodiment of my invention.

FIG. 6B schematically shows a variation of FIG. 6A in which a mesh or other IR transmissive Faraday shield 80 is placed between the heater element 60 and the radiation sensor 70. The Faraday shield minimizes undesired electrostatic coupling between the device heater(s) and sensor(s).

Figure 6C:
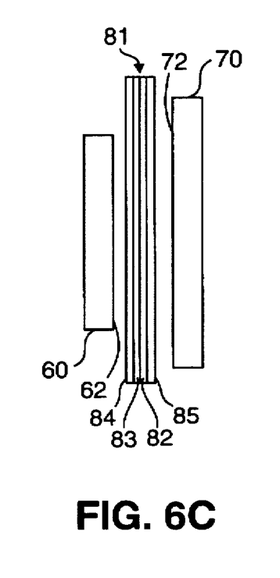
FIG. 6C schematically shows a thermal element and thermal sensor in proximity with a different type of infra-red transmitting Faraday shield in accordance with an embodiment of my invention.

FIG. 6C schematically shows a variation of FIG. 6A in which a very thin wafer 82 low mass highly IR radiation transparent material such as an IR transmissive glass, with a thin film, IR transmissive and electrically conductive coating 83 placed between the heater 62 and the sensor 72 as a Faraday shield 81. In this and other embodiments, the coating 83 is preferably of an appropriate thickness to reduce IR reflections or an additional anti-reflective coating 84 can be provided. Also, in this and other embodiments, an anti-reflection coating 85 of the same or different material(a) can be provided on the other surface of the IR transparent material to reduce loss through internal reflections. In each embodiment employing a Faraday shield, an electrical connection is provided to each such mesh and conductive coating for electrical connection of the Faraday shield(s) in conventional fashion.

Figure 6D:
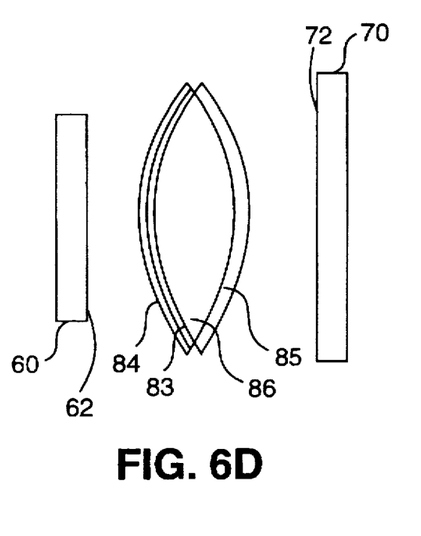
FIG. 6D schematically shows a thermal element and thermal sensor coupled by a lens in accordance with an embodiment of my invention.

FIG. 6D schematically shows an IR transmissive lens 86 of one or more elements, which collects radiation from the thermal element heater 62 and directs it to the sensor 72. Also shown are the optional, but preferred Faraday shield conductive coating 83, and anti-reflection coating(s) 84 and 85.

Figure 6E:
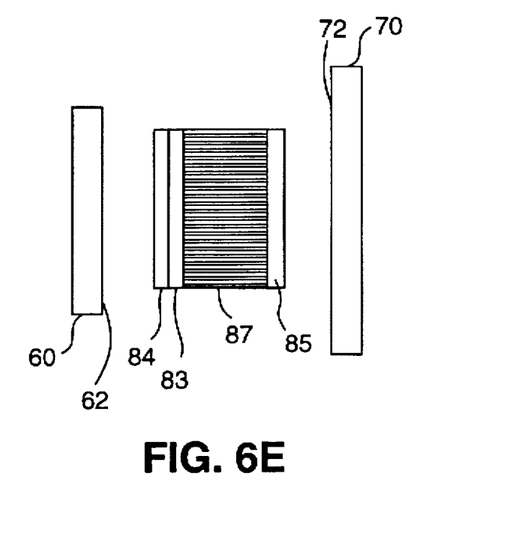
FIG. 6E schematically shows a thermal element and thermal sensor coupled by an infra-red transmitting optical waveguide in accordance with an embodiment of my invention.

FIG. 6E shows an electrothermal converter comprising a thermal element 60, heater element 62 and a thermal sensor assembly 70 with sensor 72, which are coupled by an optical waveguide 87 of IR transmissive material. The waveguide may be a single fiber or a bundle of fibers, preferably coated with an outer layer (except at the ends) to improve internal reflection in the known fashion. A Faraday shield conductive coating 83 and anti-reflection coatings 84 and 85 are also shown.

Figure 6F:
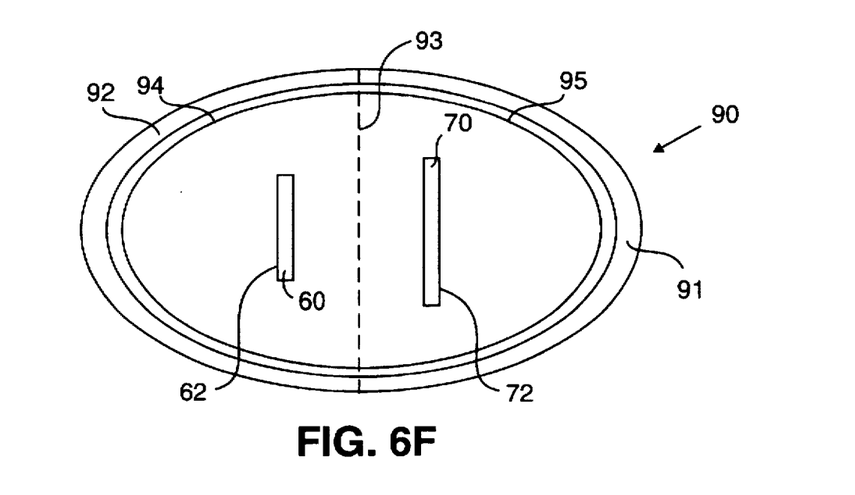
FIG. 6F schematically shows a thermal heater element and thermal sensor coupled by an elliptical, infra-red reflective mirror in accordance with an embodiment of my invention.

FIG. 6F schematically depicts a thermal converter 90 having a thermal element 60 and a thermal sensor 70 within an elliptical enclosure formed by two parts 91 and 92. The top surfaces 62 and 72 are the active elements of the thermal heater element assembly 60 and the thermal sensor assembly 70, respectively, located at the focal points of the ellipse and face outward, toward a highly reflective coating 94–95 on the inner surface of the elliptical enclosure 91–92. A Faraday shield 93 is located between the thermal heater element 60 and the thermal sensor 70.

FIGS. 7A–7E depict schematically a number of thermal converter embodiments in which the heaters and the thermal sensors are formed on the surface of the same supporting substrate, preferably a membrane of the type disclosed above. The thermal sensors may be thermoresistive or of the PN junction type.

Figure 7A:
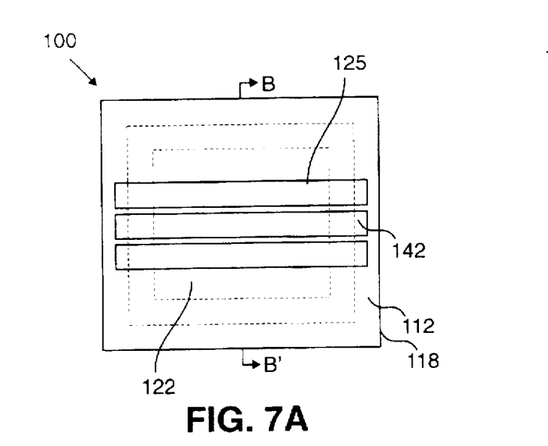
FIGS. 7A and 7C–7E schematically depict several thermal converters comprising at least one thermal heater element and at least one thermal sensor on a single thin-membrane substrate in accordance with embodiments of my invention.
Figure 7B:
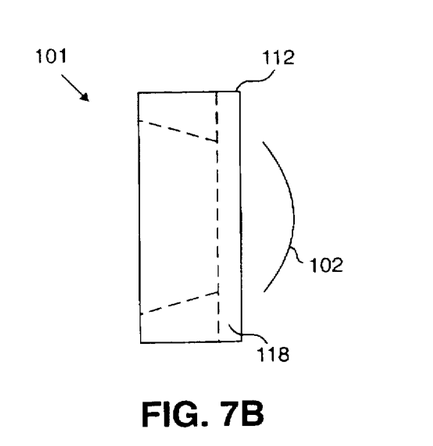
FIG. 7B schematically depicts such a thermal converter with an infra-red reflector.

FIG. 7A depicts a thermal converter 100 made with a membrane 118 in the same way described with respect to FIGS. 1A and 1B above. Two heaters 122 and 125, preferably of low temperature coefficient of resistance material, are deposited on the outer surface 112 of the membrane 118. A thermal sensor 142, preferably of high temperature coefficient of resistance material, is on the surface 112 between the heaters. FIG. 7B shows a cross-section B–B¹ of a thermal converter 101, with one or more heaters and one or more thermal sensors in the central region on the membrane 112, with an optional IR reflector 103, curved to direct additional radiation from the heater(s) to the thermal sensor(s).

Figure 7C:
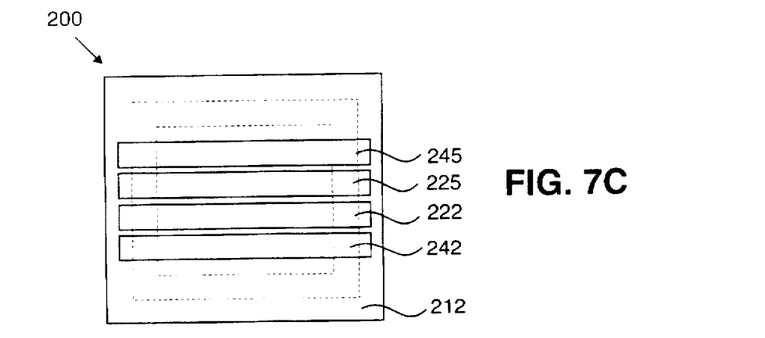

FIG. 7C schematically depicts a thermal converter 200 similar to that of FIG. 7A, having two centrally located heaters 222 and 225, and two adjacent and outside thermal sensors 242 and 245.

Figure 7D:
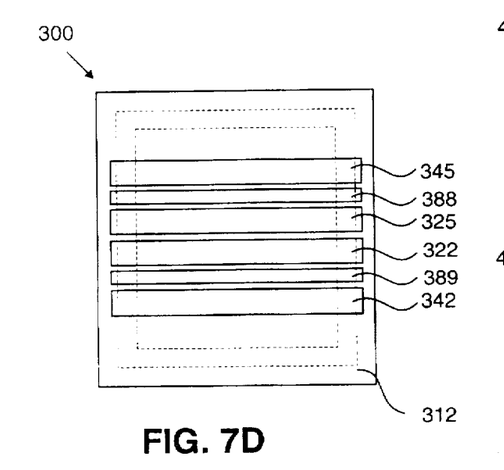
Figure 7E:
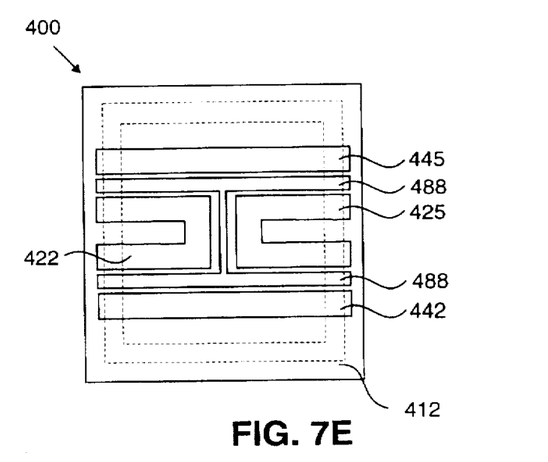

FIG. 7D schematically depicts a thermal converter 300 similar to that of FIG. 7A. The two heaters 322 and 325 are centrally located on the membrane 112, between four other elements: two thermal sensors 342 and 345, and two Faraday shield electrodes 388 and 389 separating and at least partially shielding the thermal sensors 342 and 345 from the electrostatic fields of the heaters 322 and 325. Better high frequency performance may be achieved as shown in FIG. 7E by use of bifilar heaters 422 and 425 in the thermal converter 400, which is otherwise similar to thermal converter 300, with thermal sensors 442 and 445, and shield electrode 488. Use of high temperature coefficient of resistivity, low resistance (e.g. 10–250 ohm) resistive thermal sensors for the sensors 142, 242, 245, 342, 345, 442 and 445 described herein on a low mass, low thermal conductivity substrate 112, 212, 312, 412 provides substantial advantages in lower Johnson noise and faster response as compared with other thermal converters known to me. PN junction thermal sensors, however, provide a greater thermal sensitivity and may be advantageous for use in less expensive instruments. PN junction thermal sensors can be substituted for the resistive thermal sensors described above. The specific number of PN junctions to be used depends primarily upon providing sufficient thermal collection area, avoidance of excessive, cumulative junction voltage drops, as well as noise and external circuit considerations. In my examples, I will discuss two PN junctions.

Figure 8A:
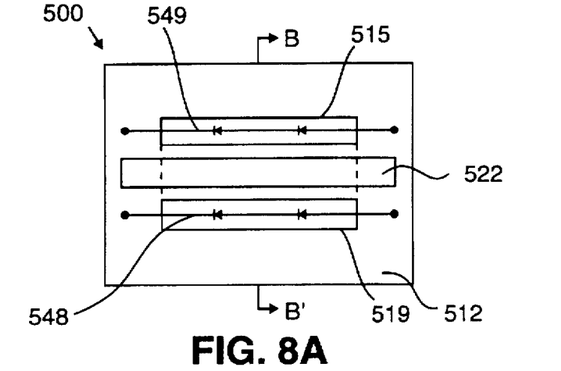
FIGS. 8A and 8B schematically show a plan view and cross-section, respectively of a thermal converter utilizing semiconductor junction thermal sensors in accordance with an embodiment of my invention.

FIG. 8A shows a schematic plan view of a thermal converter 500, similar to the thermal converter 100 of FIG. 7A. A centrally located heater 522 is between two diode arrays 548 and 549.

Figure 8B:
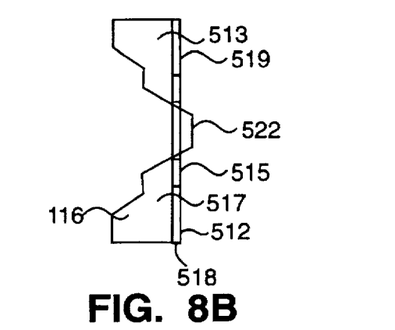

FIG. 8B is a cross-section at B–B' of the thermal converter 500. As can be seen in FIGS. 8A and 8B, the heater is on the top surface 512 of the silicon dioxide and silicon nitride membrane 518, spanning the central region where there is no silicon beneath. This configuration minimizes conductive heat loss from the heater 522. By only partially etching away the silicon, two thin regions of silicon, depicted as shelves 513 and 517, are formed. The PN junction arrays 548 and 549 are formed in these regions. Windows 515 and 519 are opened in the silicon above these regions to permit the thermal radiation from the heater 522 to more readily reach the PN junctions. The same technique, including a thin, central shelf or bridge, can be used to provide reduced mass PN junction thermal sensors for use in the various patterns of heaters and thermal sensors of my invention.

Figure 9:
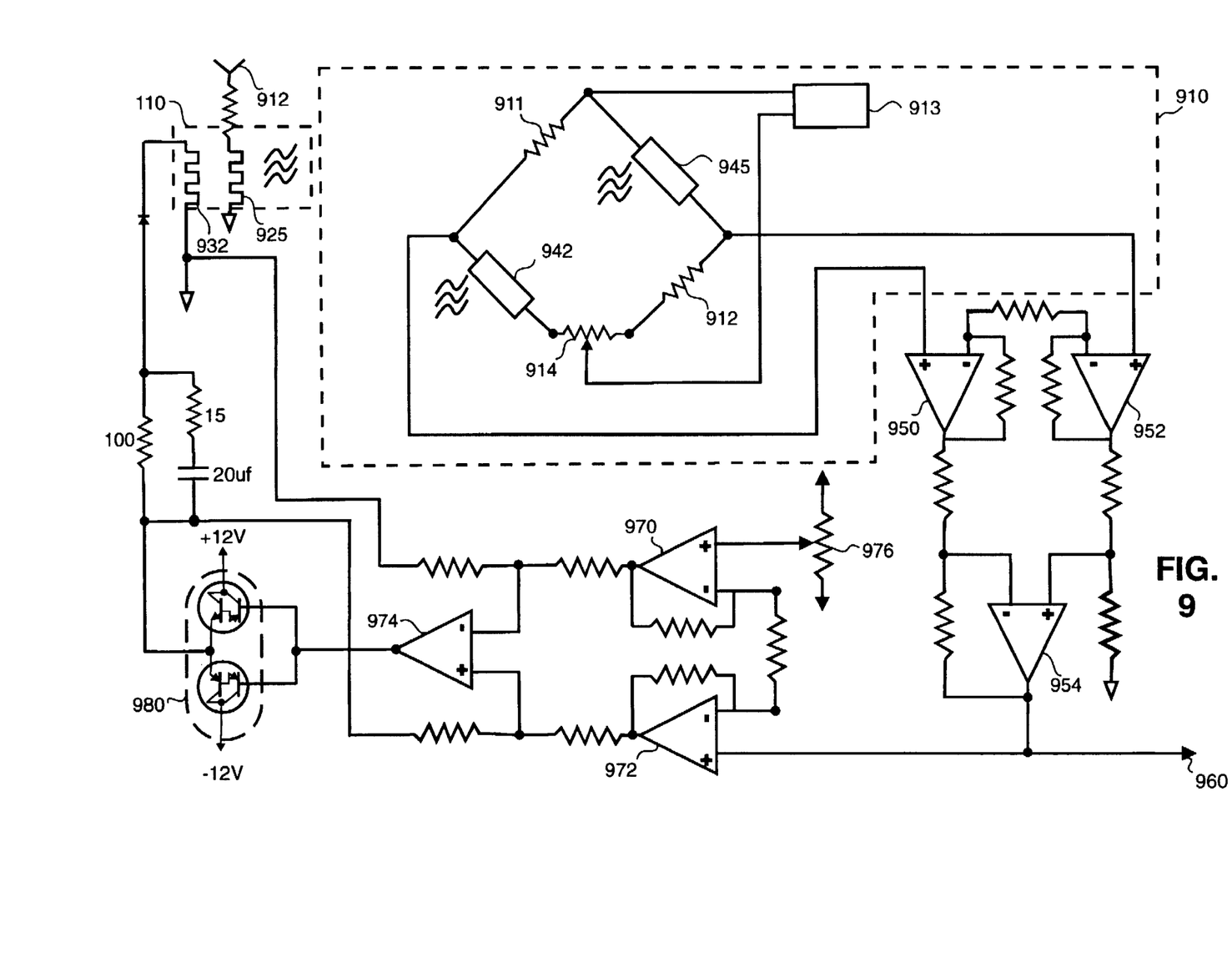
FIG. 9 is a schematic block diagram of a circuit for isothermal operation of a thermal converter in accordance with my invention.

FIG. 9 is a schematic diagram of a circuit suitable for isothermal operation of an electrothermal converter in accordance with my present invention. It includes an electrothermal converter 910 similar to the electrothermal converter 300 of FIG. 7D, including heaters 925 and 932 and sensors 942 and 945. The heater 925 is connected through a resistor to the input terminal 912 where the unknown AC signal is applied. The same or a similar circuit utilizing the principles described can be used with other embodiments of thermal converters in accordance with my invention.

Radiation from the heaters 932 and 925 (similar to those disclosed above) is collected by thermal sensors 942 and 945 (similar to 142, 242, 245, 342, 345, 442 and 445 disclosed herein). The thermal sensors 942 and 945 are electrically connected on opposite sides of a bridge circuit 910 with two temperature stable resistors 910 and 911, located in a relatively stable temperature environment. The thermal sensors 942 and 945 can be high temperature coefficient of resistivity resistors or PN junction arrays as previously discussed. When the thermal sensors 942 and 945 are resistors of approximately 100 ohm, the resistors 911 and 912 can have similar values, or may be of somewhat greater resistance, but they preferably should be of approximately equal value in this embodiment so as to limit the adjustment range of the potentiometer 914 at the input of amplifiers 950 and 952. Power source 913 provides a bias current, typically 2–5 mA. Potentiometer 914 is used to adjust the bridge balance. Its resistance range is adequate to compensate for variations of resistance in the other bridge components, typically 20% of their resistance. The use of two thermal sensors 942 and 945 to collect the summed heat from two heaters operating isothermally as described above, with the thermal sensors 942 and 945 electrically connected on opposite sides of the bridge circuit, provides a significant improvement over the single thermal sensor ohmmeter type devices and circuit disclosed in U.S. Pat. No. 4,901,006.

The resulting signal from the bridge circuit 910 is nominally balanced to circuit ground in order to simplify common mode voltage considerations in the following amplifier. The bridge circuit 910 output signal is further amplified by instrumentation amplifiers 950, 952, 954, which are 1NA110 integrated circuits in this embodiment. The output voltage of amplifier 954 is DC output 960. The value of this output is generally representative of the summed heater temperature, and a varying DC component of this output is representative of the AC RMS input voltage at the input terminal 912.

Additional instrumentation amplifiers 970, 972, 974 (1NA110 integrated circuits in this embodiment) provide additional amplification and polarity reversal for negative feedback to the reference heater 932 in the isothermal operating circuit which is preferred in accordance with my invention. Potentiometer 976 is used for bias adjustment, to set the net isothermal operating temperature of the dual heater thermal element, for example, 67° C. A type OPA633 double Darlington transistor, low impedance, power amplifier 980 with a gain of approximately one, buffers the 1NA110 integrated circuit from the reference heater and supplies the reference heater 932 with current which maintains the summed heater temperature nearly constant.

In conventional single heater thermal-elements (SJTE), the heater may rise in temperature from ambient by as much as 150° C. when the signal current rises from zero to the usual full scale RMS value of 5 mA. Such units may take 10 or more seconds to reach thermal stability and final DC output. In multi-junction thermal elements (MJTE), a substantial amount of signal energy is thermally drained off by the many thermocouple junctions which shunt the heater. This decreases the output voltage per individual junction in the MJTE when compared to the SJTE. The increased mass of MJTE may result in settling times as long as 40 seconds.

The isothermal embodiments of my present invention operate in a manner where the net temperature of the heater structure, as detected by the sensing resistors or PN junctions, remains nearly constant (isothermal operation). As the signal heater increases in temperature with increased input signal, summed heater temperature gets slightly warmer as the result of the current in heater 925. This is sensed by the thermal sensor(s) 942 and 945, which immediately reduce(s) feedback current to heater 932. This negative feedback control loop maintains the net energy of both heaters constant. The heater structure has relatively low mass and the entire structure, driven by negative feedback, with gain exceeding 50,000, remains at a constant temperature within a few millidegrees Celsius. The apparatus of the type disclosed can be expected to settle within less than 750 milliseconds to a stable final value of DC output. It is important to note that the entire measurement of AC to DC conversion occurs in one simultaneous measurement cycle in accordance with this embodiment of my invention. Conventional thermal converters require both individual AC and DC cycles, therefore, requiring two discrete settling time periods. Only one settling time period is required for the present apparatus and method.

The transfer characteristic of these embodiments should provide excellent square law conversion over wide dynamic operation range, appreciably better than the two to one dynamic range of conventional thermal-elements. DC reversal difference also is expected to be low due to reduced Thompson effects in an isothermal heater structure with non-contacting thermal sensors, and because the heater temperatures are integrated and relatively constant along the length of each of the two heaters.

Figure 10:
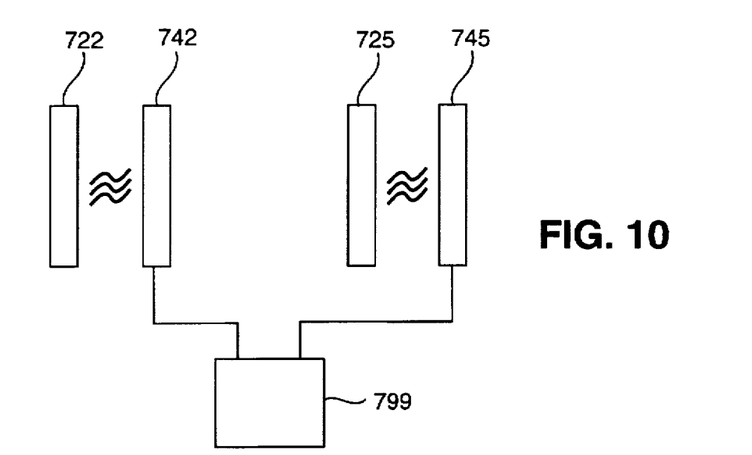
FIG. 10 schematically shows separate thermal elements and thermal sensors with a sensor output summing circuit to form a thermal converter in accordance with an embodiment of my invention.
Figure 11:
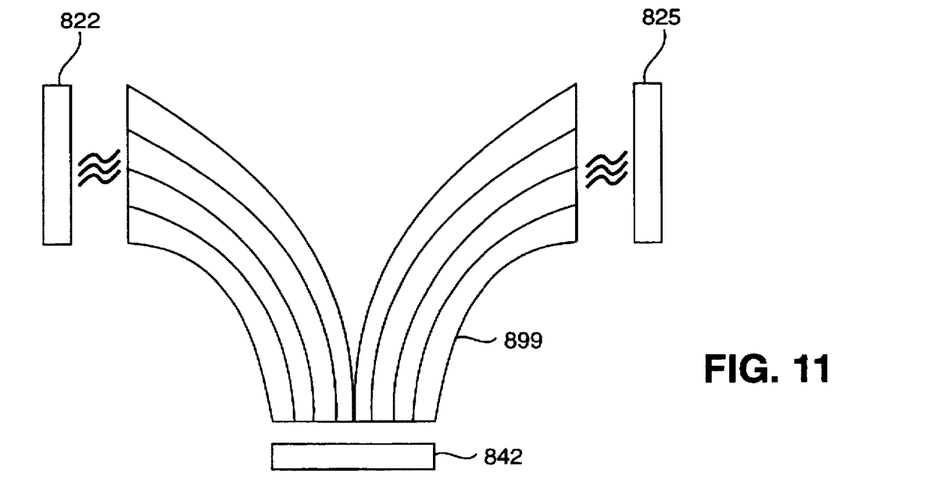
FIG. 11 schematically shows separate thermal elements and an infra-red transmissive light pipe to sum and transmit their thermal radiation to a single thermal sensor in accordance with an embodiment of my invention.

The two heater embodiments discussed so far are arranged with the two heaters in proximity to each other and either a single thermal sensor or two thermal sensors in proximity to the heater(s). These arrangements minimize the effects of ambient temperature by subjecting all thermal components to the same conditions. FIGS. 10 and 11 schematically depict two embodiments of my invention for use when it is desirable to separate the two heaters, for example, for improved electrical, electrostatic and inductive isolation.

FIG. 10 depicts a first heater 722 and a first thermal sensor 742 arranged to collect IR radiation from the first heater 722. A second thermal sensor 745 is arranged to collect IR radiation from a second heater 725. The thermal sensors 742 and 745 are connected to an electrical summing circuit 799. I prefer that the heaters 722 and 725 be similar in design and characteristics to one of the heaters described above and similar to each other. I prefer that the thermal sensors 742 and 745 also be similar in design and characteristics to one of the thermal sensors described above and to each other.

FIG. 11 depicts a different apparatus for summing the effects of two heaters in accordance with an embodiment of my invention. Two separate heaters 822 and 825 are provided, which can be similar to heaters 722 and 725. An IR transmissive light pipe or conduit, such as two bundles of IR transmissive optical fibers, collects radiation from the heaters 822 and 825, and transmits it to the thermal sensor 842, which can be similar to thermal sensor 742. This configuration further optimizes the electrical isolation between the two heaters, and between the heaters and sensor.

In several of the embodiments of my invention, I have only described components and relationships between components sufficiently to illustrate principles of my invention, and have not described all components contemplated for such embodiments. It will be clear to those skilled in the art that my invention encompasses other combinations and that, in particular, the various radiation collection enhancing techniques and components, such as proximity, lenses, light pipes, reflectors, first surface mirrors, anti-reflection coatings, etc., and various types of disclosed heaters and thermal sensors can be employed in embodiments where such components and configurations are not specifically described.

I claim:

1. An electrothermal conversion element for use in conversion of a first signal of unknown RMS amplitude to another electrical signal having an amplitude representative of the RMS amplitude of the first signal, said conversion element comprising a thin, low mass, low thermal conductivity substrate, a first low mass, thin film heater of relatively low temperature coefficient of electrical resistivity on a surface of said substrate, and a low mass, thermoresistive sensor element of relatively high temperature coefficient of electrical resistivity positioned to receive IR radiation from said heater.

2. The electrothermal conversion element of claim 1 wherein said first heater and said thermal sensor are on the same surface of the same substrate.

3. The electrothermal conversion element of claim 1 wherein the substrate comprises silicon dioxide and silicon nitride.

4. The electrothermal conversion element of claim 1 wherein the substrate is an unsupported membrane in its central region underlying at least the major portion of said heater.

5. The electrothermal conversion element of claim 1 wherein said heater is arranged in a bifilar pattern.

6. The electrothermal conversion element of claim 1 further comprising a second low mass, thin film heater of relatively low temperature coefficient of electrical resistivity on said substrate and in close proximity to said first heater.

7. The electrothermal conversion element of claim 1 wherein said first heater and said thermal sensor are each on separate thin, low mass, low thermal conductivity substrates.

8. The electrothermal conversion element of claim 7 wherein the substrate comprises silicon dioxide and silicon nitride.

9. The electrothermal conversion element of claim 7 wherein the substrate is an unsupported membrane in its central region underlying at least the major portion of said heater.

10. The electrothermal conversion element of claim 7 wherein said heater is arranged in a bifilar pattern.

11. An electrothermal conversion element for use in conversion of a first signal of unknown RMS amplitude to another electrical signal having an amplitude representative of the RMS amplitude of the first signal, said conversion element comprising a thin, low mass substrate having low thermal conductivity and high electrical resistivity, two low mass, thin film heaters of relatively low temperature coefficient of electrical resistivity on a surface of said substrate, and a low mass thermal sensor element arranged to receive only radiant thermal radiation from said heaters.

12. The electrothermal conversion element of claim 11 wherein said first heater and said thermal sensor are on the same surface of the same substrate.

13. The electrothermal conversion element of claim 11 wherein the substrate comprises silicon dioxide and silicon nitride.

14. The electrothermal conversion element of claim 11 wherein the substrate is an unsupported membrane in its central region underlying at least the major portion of said heaters.

15. The electrothermal conversion element of claim 11 wherein said each of said heaters is arranged in a bifilar pattern.

16. The electrothermal conversion element of claim 11 wherein said thermal sensor is a low mass, thin film thermoresistive sensor of relatively high temperature coefficient of resistivity.

17. The electrothermal conversion element of claim 16 wherein said thermal sensor is on the same surface of the same substrate as said heaters.

18. The electrothermal conversion element of claim 17 further comprising a second thermal sensor of the same type on the same surface of the same substrate as said heaters.

19. The electrothermal conversion element of claim 17 wherein the substrate is a thin, unsupported membrane in its central region underlying the major portion of said heater and underlying at least the major portion of said thermal sensor.

20. The electrothermal conversion element of claim 17 wherein said heater is arranged in a bifilar pattern.

21. The electrothermal conversion element of claim 11 wherein the thermal sensor comprises an array of at least two PN junctions in series without intervening cold junctions in close proximity to and arranged to receive IR radiation from said heater.

22. An electrical signal conversion apparatus for receiving a first electrical signal of unknown RMS amplitude and for producing an electrical output signal having an amplitude representative of the RMS amplitude of the first electrical signal, said apparatus comprising a thin, low mass, low thermal conductivity substrate, a first, low mass, thin film heater on a surface of said substrate, said heater powered by the first electrical signal, and a thermal sensor arranged to receive only radiant thermal energy from said first heater and producing the representative signal.

23. The apparatus of claim 22 further comprising a second, low mass, thin film heater on said surface, wherein the first and second heaters are of substantially the same construction, and said thermal sensor is arranged to receive only radiant thermal energy from both said first and second heaters.

24. The apparatus of any of claims 22–23 wherein an infrared transmissive lens collects radiation from said heater(s) and focusses it on said thermal sensor(s).

25. The apparatus of any of claims 22–23 wherein one or more optical waveguides collect radiation from said heater(s) and convey it to said thermal sensor(s).

26. An electrical signal conversion apparatus comprising the element of claim 23 wherein the first signal of unknown amplitude is connected to the first heater and a second electrical signal from the output of the thermal sensor is connected to heat the second heater via a negative feedback amplifier circuit which is arranged to maintain the temperature sensed by said thermal sensor relatively constant with variations in the unknown amplitude signal.

27. The apparatus of claim 23 wherein each of said heaters has a relatively low temperature coefficient of electrical resistivity and each of said thermal sensors has a relatively high temperature coefficient of electrical resistivity.

28. The apparatus of claim 26 wherein each of said heaters has a relatively low temperature coefficient of electrical resistivity and each of said thermal sensors has a relatively high temperature coefficient of electrical resistivity.

29. An electrical signal conversion apparatus for receiving a first electrical signal of unknown RMS amplitude and for producing an electrical output signal having an amplitude representative of the RMS amplitude of the first electrical signal, said apparatus comprising a first, low mass heater connected to receive and be heated by said first electrical signal, a second, low mass heater, first and second thermal sensors arranged to sense radiant heat from said heaters, said thermal sensors being electrically connected on opposite sides of a bridge circuit, an amplifier connected to the output of the bridge circuit, said amplifier being arranged and connected to provide a negative feedback electrical signal to heat said second heater.

30. The apparatus of claim 29 wherein each of said heaters has a relatively low temperature coefficient of electrical resistivity and each of said thermal sensors has a relatively high temperature coefficient of electrical resistivity.

31. A method for measuring the RMS amplitude of a first signal comprising the steps of claim 29 and further comprising the step of measuring the amplitude of a signal derived from the second signal.

32. A method for conversion from a first electrical signal to a second electrical signal of proportional RMS amplitude comprising the steps of heating a first heater by the first electrical signal which is the signal to be converted, concurrently heating a second heater by the second electrical signal, transmitting radiant heat from the first and second heaters to two thermal sensors which are electrically connected on opposite sides of a bridge circuit, and utilizing the output of the thermal sensor to maintain the summed detected temperature of the two heaters relatively constant at the desired nominal temperature by controlling the amplitude of the second signal.

33. The apparatus of claim 32 wherein each of said heaters has a relatively low temperature coefficient of electrical resistivity and each of said thermal sensors has a relatively high temperature coefficient of electrical resistivity.

* * * * *